US012688252B1

(12) United States Patent
Brown et al.

(10) Patent No.: US 12,688,252 B1
(45) Date of Patent: Jul. 21, 2026

(54) SIMULATION SYSTEMS WITH MAPPING BETWEEN NON-CONFORMAL GEOMETRIES

(71) Applicant: ANSYS, INC., Canonsburg, PA (US)

(72) Inventors: David Anthony Zaffina Brown, Waterloo (CA); Stephen Reuss, Kitchener (CA); Philip John Zwart, St. Agatha (CA); Daniel Neale Williams, Kitchener (CA)

(73) Assignee: ANSYS, INC., Canonsburg, PA (US)

( * ) Notice: Subject to any disclaimer, the term of this patent is extended or adjusted under 35 U.S.C. 154(b) by 672 days.

(21) Appl. No.: 17/326,620

(22) Filed: May 21, 2021

Related U.S. Application Data

(60) Provisional application No. 63/126,827, filed on Dec. 17, 2020.

(51) Int. Cl.
 *G06F 30/23* (2020.01)
 *G06F 17/12* (2006.01)
 *G06F 30/10* (2020.01)
(52) U.S. Cl.
 CPC .............. *G06F 17/12* (2013.01); *G06F 30/10* (2020.01); *G06F 30/23* (2020.01)
(58) Field of Classification Search
 CPC .......... G06F 17/12; G06F 30/10; G06F 30/23; G06F 30/00; G06F 30/025; G06F 30/367; G06F 30/398; G06F 2111/00–2119/22
 USPC .......................................................... 703/2
 See application file for complete search history.

(56) References Cited

U.S. PATENT DOCUMENTS

| | | | | |
|---|---|---|---|---|
| 10,354,027 | B1 * | 7/2019 | Verma ..................... | G06F 30/20 |
| 2022/0091580 | A1 * | 3/2022 | Bandara ................ | B29C 64/386 |

FOREIGN PATENT DOCUMENTS

CN 106547964 A * 3/2017 ............. G06F 30/20

OTHER PUBLICATIONS

Cai, Xiao-Chuan, Maksymilian Dryja, and Marcus Sarkis. "Overlapping nonmatching grid mortar element methods for elliptic problems." SIAM Journal on Numerical Analysis 36, No. 2 (1999): 581-606. (Year: 1999).*
Chesshire, G., and William D. Henshaw. "A scheme for conservative interpolation on overlapping grids." SIAM Journal on Scientific Computing 15, No. 4 (1994): 819-845. (Year: 1994).*
Storti, Bruno, Luciano Garelli, Mario Storti, and Jorge D'elia. "Optimization of an internal blade cooling passage configuration using a Chimera approach and parallel computing." Finite Elements in Analysis and Design 177 (2020): 103423. (Year: 2020).*

(Continued)

*Primary Examiner* — John E Johansen
(74) *Attorney, Agent, or Firm* — WOMBLE BOND DICKINSON (US) LLP

(57) ABSTRACT

Coupling of physics solutions (e.g., a first physics solution and a second physics solution) in a multi-physics simulation that includes non-conformal spaces can use extrapolation to determine data values for unmapped nodes by computing extrapolated values based on both mapped values from mapped nodes and data for unmapped nodes. The extrapolated values for an unmapped node are computed using a set of equations that include mapped values from nearby mapped nodes and data for nearby unmapped nodes. The methods and systems can provide improved computational efficiency by reducing the amount of memory required for the computations.

20 Claims, 9 Drawing Sheets

$$\phi_k(P_1) = \sum_{j=1}^{n_{nodes,k}} \phi_k(x_j) N_j(u_k, v_k)$$

215

$$\phi(P_1) = \sum_{k=1}^{n_{nbrFaces}} \left[ \frac{\alpha_k}{\sum_m \alpha_m} \phi_k(P_1) \right]$$

217

(56)  References Cited

OTHER PUBLICATIONS

Dureisseix, David, and Henri Bavestrello. "Information transfer between incompatible finite element meshes: application to coupled thermo-viscoelasticity." Computer Methods in Applied Mechanics and Engineering 195, No. 44-47 (2006): 6523-6541. (Year: 2006).*

Durand, W. F. (1934). Aerodynamic Theory: A General Review of Progress Under a Grant of the Guggenheim Fund for the Promotion of Aeronautics. Berlin, Heidelberg: Springer Berlin Heidelberg. (Year: 1934).*

Barth, Timothy J. "Aspects of unstructured grids and finite-volume solvers for the Euler and Navier-Stokes equations." AGARD, special course on unstructured grid methods for advection dominated flows (1992). (Year: 1992).*

Zwart, P. J. "The integrated space-time finite volume method". (University of Waterloo, 1999). Thesis. (Year: 1999).*

Reuss, Stephen. "A Generally Applicable Mesh Adaptation Criterion". (University of Waterloo, 2002). Thesis. (Year: 2002).*

Aguerre, Horacio J., Santiago Márquez Damián, Juan M. Gimenez, and Norberto M. Nigro. "Development of a parallelised fluid solver for problems with mesh interfaces and deforming domains." Computers & Fluids 168 (2018): 110-129. (Year: 2018).*

Liu, Jian. Multi-block computations and turbulence modeling for turbomachinery flows. University of Florida, 1996. <https://www.proquest.com/openview/aa78170fe4c71b7298b21f7699c4eeaf/1?pq-origsite=gscholar&cbl=18750&diss=y> (Year: 1996).*

Ahusborde, Etienne, and S. Glockner. "An implicit method for the Navier-Stokes equations on overlapping block-structured grids."

International journal for numerical methods in fluids 62, No. 7 (2010): 784-801. (Year: 2009).*

Rose, Ollie James. Curvilinear interface methodology for finite-element applications. Old Dominion University, 2000. <https://www.proquest.com/openview/f55373e9a3a5da170d6b556ed41d44b7/1?pq-origsite=gscholar&cbl=18750&diss=y> (Year: 2000).*

T. Tzong, H. H. Chen, K. C. Chang, T. Wu and T. Cebeci. A general interface method for aeroelastic analysis of aircraft. NASA Technical Report No. MDC 96K7062, Feb. 1996, 44 pages.

S. Brown. Displacement extrapolation for CFD+CSM aeroelastic analysis. AIAA Paper 97-1090, 1997, pp. 291-300.

G. J. Kennedy. Aerostructural analysis and design optimization of composite aircraft. PhD thesis, University of Toronto, Toronto, Canada, 2012, 178 pages.

TACS software, maintained by G. J. Kennedy's research group: https://github.com/smdogroup/tacs, downloaded Jun. 21, 2021, 4 pages.

G. S. L. Goura, K. J. Badcock, M. A. Woodgate and B. E. Richards. A data exchange method for fluid-structure interaction problems. The Aeronautical Journal, 105(1046):215-221, 2001.

M. Sadeghi, F. Liu, K. L. Lai and H. M. Tsai. Application of three-dimensional interfaces for data transfer in aeroelastic applications. AIAA Paper No. AIAA-2004-5376, 2004, 30 pages.

P. C. Chen and I. Jadic. Interfacing of fluid and structural models via innovative boundary element method. AIAA Journal, 14(6):379-419, 1998, 6 pages.

T. C. S. Rendall and C. B. Allen. Improved radial basis function fluid-structure coupling via efficient localized Implementation. Int. J. Numer. Meth. Engng, 78:1188-1208, 2009.

* cited by examiner

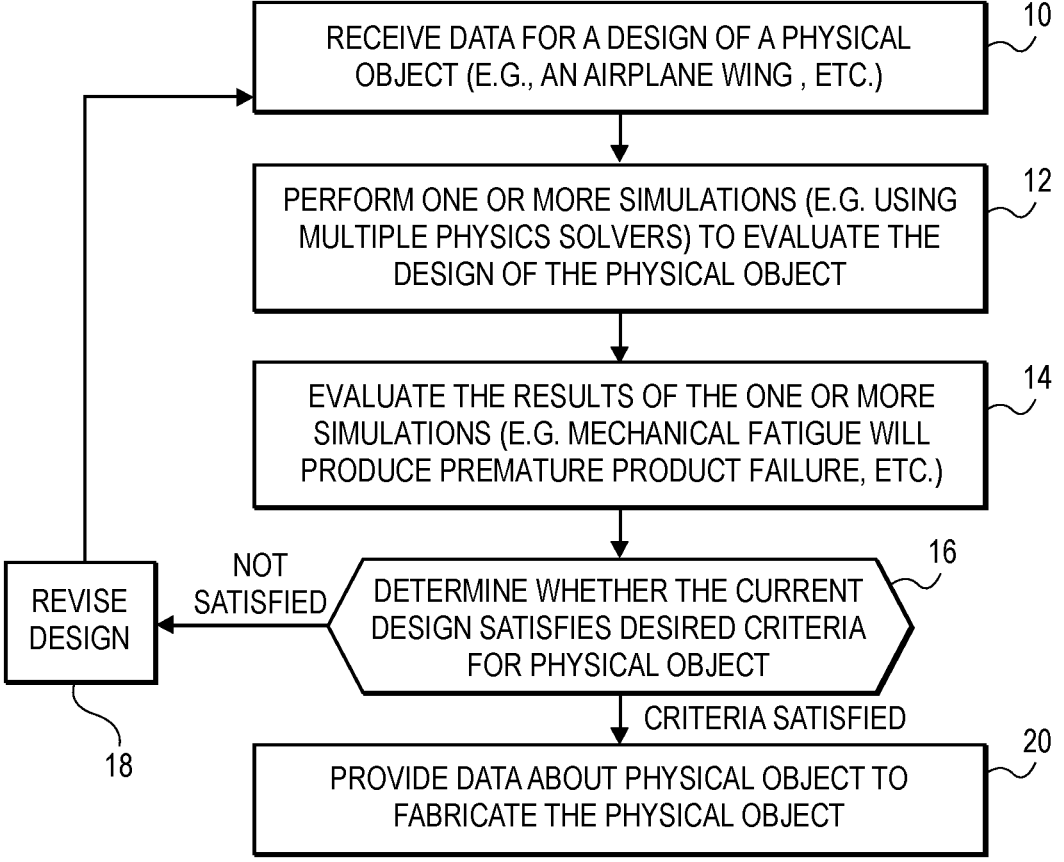

RECEIVE DATA FOR A DESIGN OF A PHYSICAL OBJECT (E.G., AN AIRPLANE WING , ETC.) 10

PERFORM ONE OR MORE SIMULATIONS (E.G. USING MULTIPLE PHYSICS SOLVERS) TO EVALUATE THE DESIGN OF THE PHYSICAL OBJECT 12

EVALUATE THE RESULTS OF THE ONE OR MORE SIMULATIONS (E.G. MECHANICAL FATIGUE WILL PRODUCE PREMATURE PRODUCT FAILURE, ETC.) 14

REVISE DESIGN 18

NOT SATISFIED

DETERMINE WHETHER THE CURRENT DESIGN SATISFIES DESIRED CRITERIA FOR PHYSICAL OBJECT 16

CRITERIA SATISFIED

PROVIDE DATA ABOUT PHYSICAL OBJECT TO FABRICATE THE PHYSICAL OBJECT 20

FIG. 1

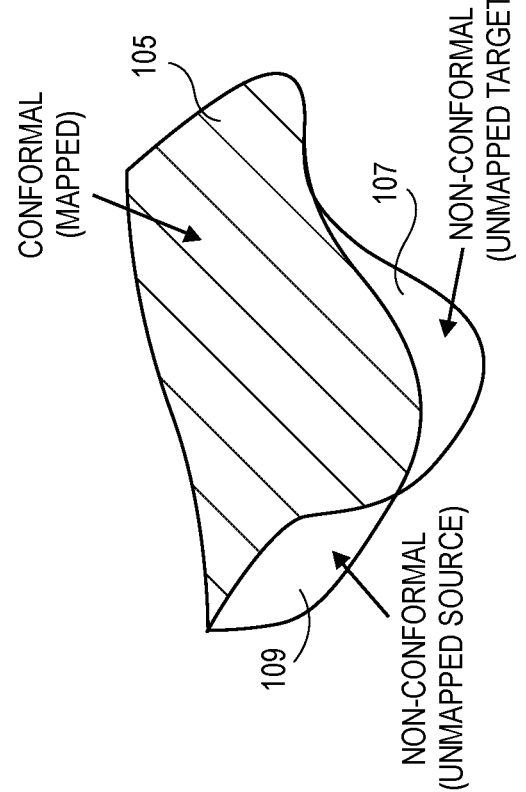
CONFORMAL (MAPPED)
105
107
NON-CONFORMAL (UNMAPPED TARGET)
NON-CONFORMAL (UNMAPPED SOURCE)
109
FIG. 2A
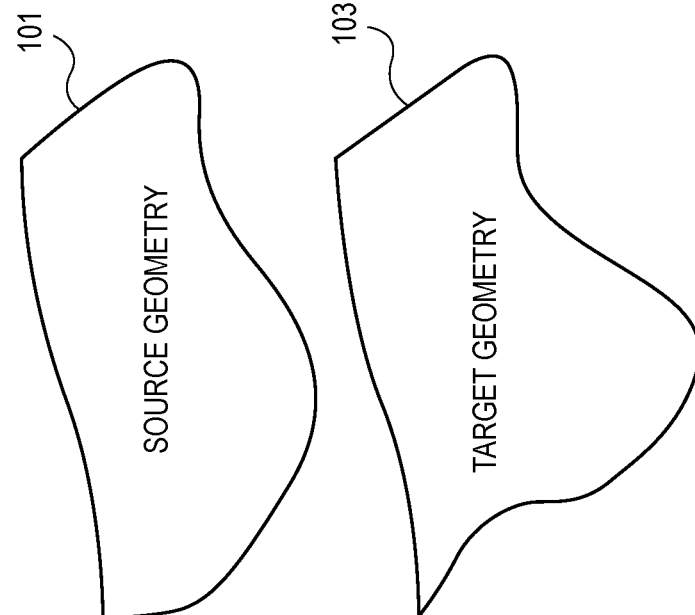
101
SOURCE GEOMETRY
103
TARGET GEOMETRY

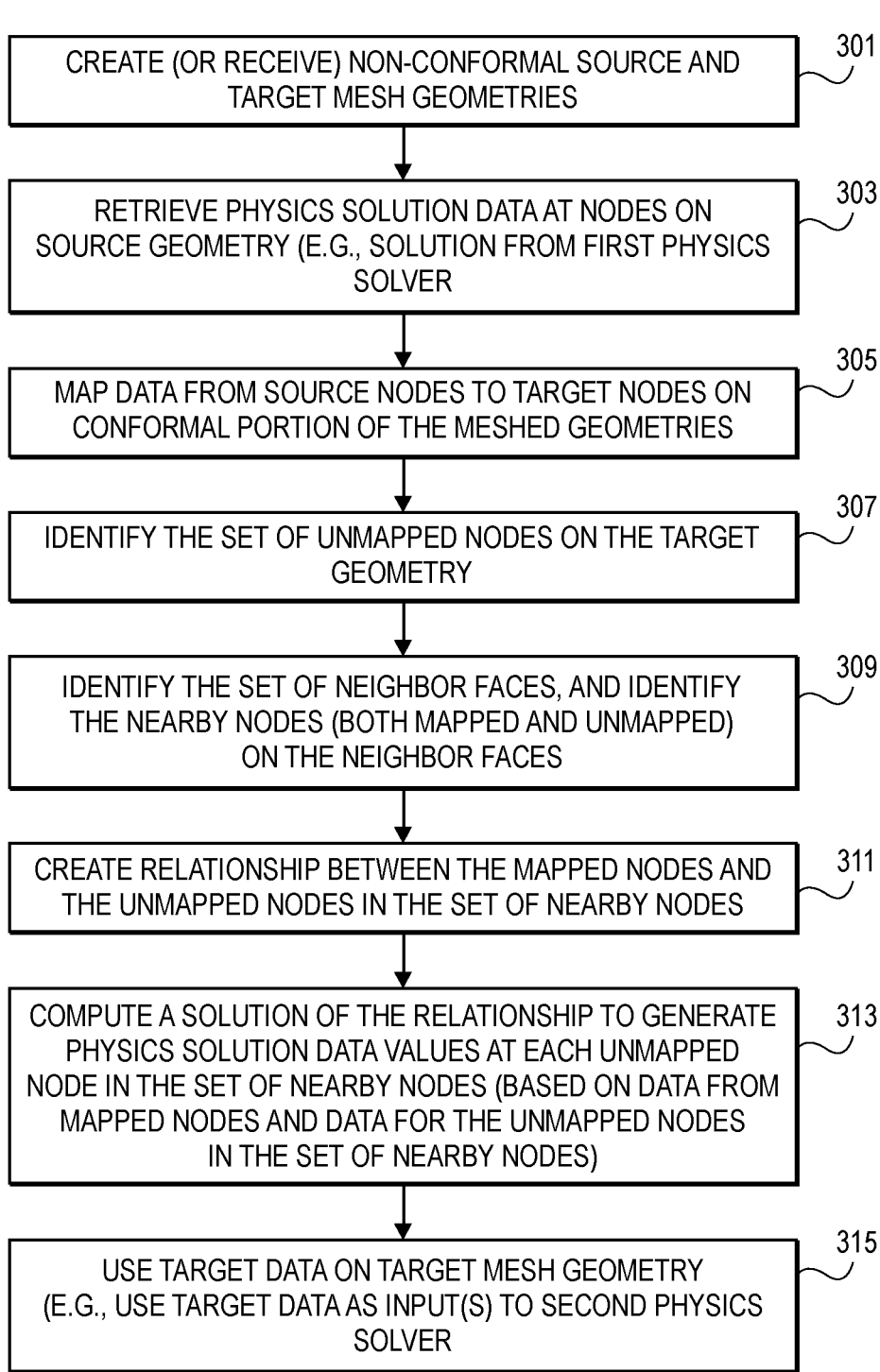

CREATE (OR RECEIVE) NON-CONFORMAL SOURCE AND TARGET MESH GEOMETRIES ⁓301

RETRIEVE PHYSICS SOLUTION DATA AT NODES ON SOURCE GEOMETRY (E.G., SOLUTION FROM FIRST PHYSICS SOLVER ⁓303

MAP DATA FROM SOURCE NODES TO TARGET NODES ON CONFORMAL PORTION OF THE MESHED GEOMETRIES ⁓305

IDENTIFY THE SET OF UNMAPPED NODES ON THE TARGET GEOMETRY ⁓307

IDENTIFY THE SET OF NEIGHBOR FACES, AND IDENTIFY THE NEARBY NODES (BOTH MAPPED AND UNMAPPED) ON THE NEIGHBOR FACES ⁓309

CREATE RELATIONSHIP BETWEEN THE MAPPED NODES AND THE UNMAPPED NODES IN THE SET OF NEARBY NODES ⁓311

COMPUTE A SOLUTION OF THE RELATIONSHIP TO GENERATE PHYSICS SOLUTION DATA VALUES AT EACH UNMAPPED NODE IN THE SET OF NEARBY NODES (BASED ON DATA FROM MAPPED NODES AND DATA FOR THE UNMAPPED NODES IN THE SET OF NEARBY NODES) ⁓313

USE TARGET DATA ON TARGET MESH GEOMETRY (E.G., USE TARGET DATA AS INPUT(S) TO SECOND PHYSICS SOLVER ⁓315

FIG. 4

$$\phi_k(P_1) = \sum_{j=1}^{n_{nodes,k}} \phi_k(x_j) N_j(u_k, v_k)$$

$$\phi(P_1) = \sum_{k=1}^{n_{nbrFaces}} \left[ \frac{\alpha_k}{\sum_m \alpha_m} \phi_k(P_1) \right]$$

SIMULATION SYSTEMS WITH MAPPING BETWEEN NON-CONFORMAL GEOMETRIES

This application claims the benefit of U.S. provisional patent application No. 63/126,827, filed Dec. 17, 2020, and this provisional patent application is hereby incorporated herein by reference.

BACKGROUND

This disclosure is related to the field of computer simulations, and more particularly to the field of multiphysics simulations in which a series of physics simulations are performed on a simulated physical object, often before the physical object is manufactured.

Multiphysics simulations typically involve the use of different laws, models or principles in physics to analyze multiple, simultaneous physical phenomena. For example, during the design of an airplane wing, a designer can consider both aerodynamic phenomena caused by the wing's movement through air (a fluid) and mechanical phenomena such as, for example, load and stress on the wing during its movement through the air. The phenomena occur simultaneously, and one phenomena can affect the other phenomena. The aerodynamic phenomena can be analyzed with a first physics solver (that provides solutions for equations that describe the fluid flow) while the mechanical phenomena can be analyzed by a second physics solver (that provides solutions for equations that describe mechanical properties such as displacements). Often, a designer will seek to have the outputs from one solver be used as an input to another solver. These outputs are often in the form of data values at nodes of a mesh over a simulated physical space, such as a surface or volume of an airplane's wing. Such use of the outputs from one solver as inputs for another is a form of coupling of the physics problems. The coupling involves mapping of data between the physics solvers, and this mapping can be between two different meshes.

Multiphysics simulations normally require coupling of different physics problems that often use different definitions of physical space so that the different definitions mean the physical spaces are not identical and contain portions that do not overlap; for example, a first physics solver uses a first surface (e.g., a first mesh) that is different than a second surface (a second mesh) used by a second physics solver, and the values on the first surface from the first physics solver need to be mapped to nodes in the second mesh on the second surface before the second solver can be used. The different surfaces cause non-conformal regions where there are no values from the first surface that can be directly mapped to the second surface. This problem is common for wind turbines, aircraft wings, turbomachinery blades, etc. as the surfaces or volumes are modeled with non-conformal geometries. This problem is also common for electric motors and generators and power control systems (e.g., bus bars) as the volumes are modeled with non-conformal volumes.

There have been many prior attempts at mapping between non-conformal spaces in the context of multiphysics simulations. These prior attempts include those attempts described in the following literature: (1) T. Tzong, H. H. Chen, K. C. Chang, T. Wu and T. Cebeci. A general interface method for aeroelastic analysis of aircraft. NASA Technical Report No. MDC 96K7062; (2) S. Brown. Displacement extrapolation for CFD+CSM aeroelastic analysis. AIAA Paper 97-1090, 1997; (3) G. J. Kennedy. Aerostructural analysis and design optimization of composite aircraft. PhD thesis, University of Toronto, Toronto, Canada, 2012; (4) TACS software, maintained by G. J. Kennedy's research group: https://github.com/smdogroups/tacs; (5) G. S. L. Goura, K. J. Badcock, M. A. Woodgate and B. E. Richards. A data exchange method for fluid-structure interaction problems. The Aeronautical Journal, 105(1046):215-221, 2001; (6) M. Sadeghi, F. Liu, K. L. Lai and H. M. Tsai. Application of three-dimensional interfaces for data transfer in aeroelastic applications. AIAA Paper No. AIAA-2004-5376, 2004; (7) P. C. Chen and I. Jadic. Interfacing of fluid and structural models via innovative boundary element method. AIAA Journal, 14(6):379-419, 1998; and (8) T. C. S. Rendall and C. B. Allen. Improved radial basis function fluid-structure coupling via efficient localized implementation. Int. J. Numer. Meth. Engng, 78:1188-1208, 2009. These prior attempts often work for only certain types of problems (e.g., those with displacement field data) or produce discontinuities in the target data or consume enormous amounts of DRAM memory when the size of the problem is large.

SUMMARY OF THE DESCRIPTION

Coupling of physics solutions (e.g., a first physics solution and a second physics solution) in a multi-physics simulation that includes non-conformal spaces can use extrapolation to determine data values for unmapped nodes by computing extrapolated values based on both mapped values from mapped nodes and data for unmapped nodes. The extrapolated values for an unmapped node are computed using a set of equations that include mapped values from nearby mapped nodes and data for nearby unmapped nodes. The methods and systems can provide improved computational efficiency by reducing the amount of memory required for the computations relative to prior approaches referred to above and can also reduce computational time required relative to prior approaches.

A method according to one embodiment can include the following operations: receiving a representation of a source space with associated data values at nodes in the source space; receiving a representation of a target space having nodes, at least some of the nodes in the target space to receive, through a mapping, at least some data values from nodes in the source space; identifying a set of unmapped nodes in the target space; determining, for each unmapped node in the target space, a set of nearby neighbor nodes that can include one or more mapped nodes or one or more unmapped nodes or a combination of a set of mapped and unmapped nodes; creating a relationship between the one or more mapped nodes and the one or more unmapped nodes in the set of nearby neighbor nodes for the set of unmapped nodes; and, computing a solution of the relationship to generate data values at each unmapped node based on both data from mapped nodes and data about the unmapped nodes. In one embodiment, the set of unmapped nodes are in a portion of the target space that does not overlap with the source space and the mapped nodes are in a portion of the target space that does overlap with the source space, and wherein the data values at nodes in the source space represent one or more physical values from a first physics solution about a simulated object being designed in a simulation system in the data processing system. In one embodiment, the nodes in the source space are nodes in a first mesh, and the nodes in the target space are nodes in a second mesh, and the first mesh and the second mesh are non-conformal. In one embodiment, the source space and the target space are one of: (a) a surface, or (b) a volume. In one embodiment, the one or more physical values from the first physics solution are used to compute one or more physical values in a second physics solution to determine characteristics of the simulated object before a physical object is manufactured based on the simulated object, and wherein the mapping couples the first physics solution to the second physics solution.

In one embodiment, the data values at each unmapped node are extrapolated values from both (a) data from mapped nodes and (b) coefficient data relating values at unmapped nodes to values at neighbor nodes. In one embodiment, a neighbor node in the set of nearby neighbor nodes is considered nearby to an unmapped node for example when: (1) the neighbor node is within a first radius from the unmapped node; or (b) the neighbor node is in a face (or element) that shares an edge with a face (or element) containing the unmapped node; or (c) the face (or element) containing the unmapped node shares a node with a face (or element) containing the neighbor node. In one embodiment, the relationship comprises a set of equations that include first physics solution data from nearby mapped nodes and coefficients for nearby unmapped nodes. In one embodiment, a number of unmapped nodes in the set of equations is equal to a number of equations in the set of equations.

The aspects and embodiments described herein can include non-transitory machine readable media that can store executable computer program instructions that when executed cause one or more data processing systems to perform the methods described herein when the computer program instructions are executed. The instructions can be stored in non-transitory machine readable media such as in dynamic random access memory (DRAM) which is volatile memory or in nonvolatile memory, such as flash memory or other forms of memory. The aspects and embodiments described herein can also be in the form of data processing systems that are built or programmed to perform these methods. For example, a data processing system can be built with hardware logic to perform these methods or can be programmed with a computer program to perform these methods and such a data processing system can be considered a simulation system.

The above summary does not include an exhaustive list of all embodiments and aspects in this disclosure. All systems, media, and methods can be practiced from all suitable combinations of the various aspects and embodiments summarized above and also those disclosed in the detailed description below.

BRIEF DESCRIPTION OF THE DRAWINGS

The present invention is illustrated by way of example and not limitation in the figures of the accompanying drawings in which like references indicate similar elements.

FIG. 1 is a flowchart which illustrates a method which can be used according to one or more embodiments described herein to design a product using multiphysics simulation.

FIG. 2A shows an example of source and target geometries that are nonconformal such that when they are overlapped, there are regions in the target that are not present in the source.

FIG. 4 is a flowchart that shows a method according to one embodiment.

DETAILED DESCRIPTION

Figure 2B:
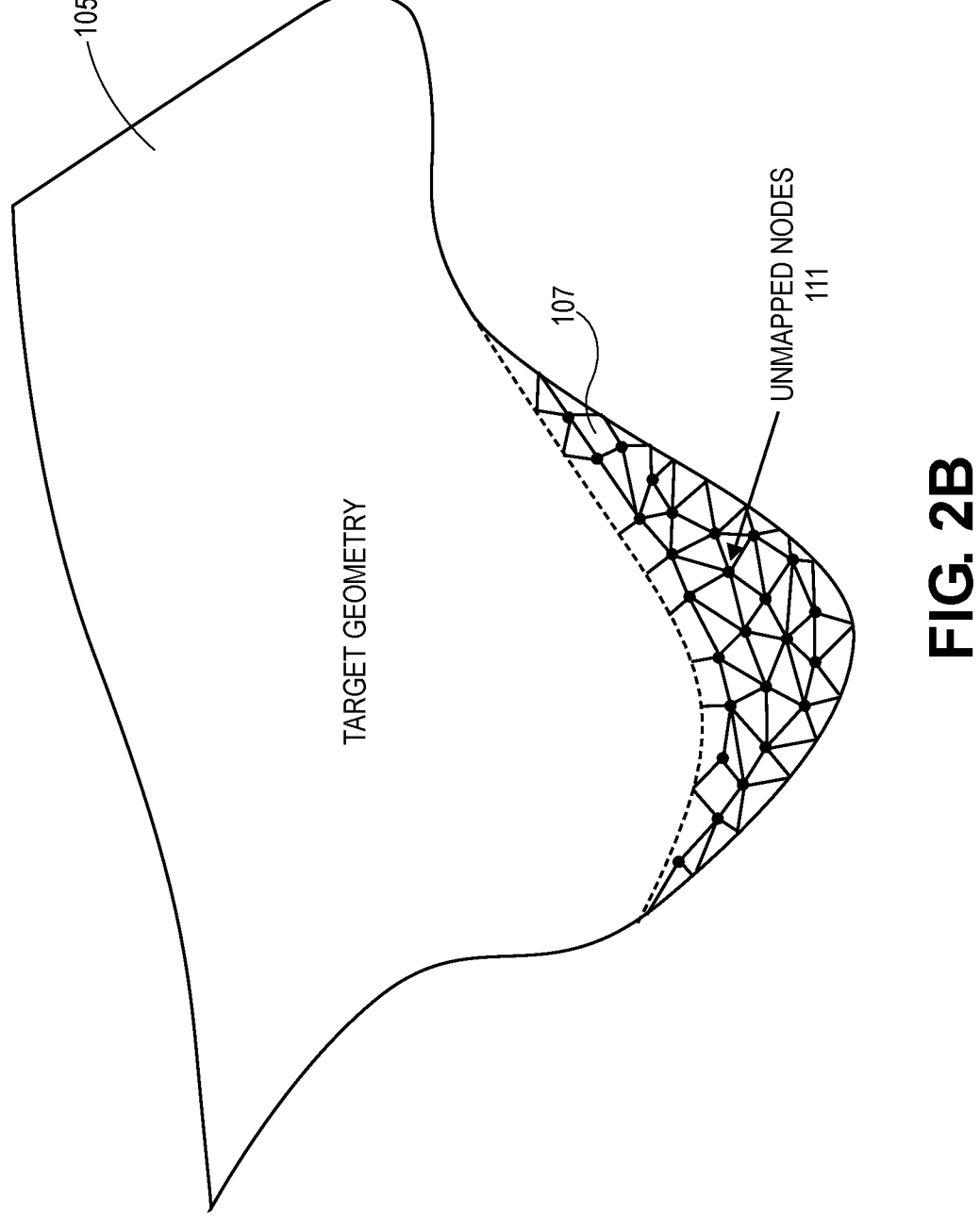
FIG. 2B shows an example of unmapped nodes in a target geometry.

Various embodiments and aspects will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments.

Reference in the specification to "one embodiment" or "an embodiment" means that a particular feature, structure, or characteristic described in conjunction with the embodiment can be included in at least one embodiment. The appearances of the phrase "in one embodiment" in various places in the specification do not necessarily all refer to the same embodiment. The processes depicted in the figures that follow are performed by processing logic that comprises hardware (e.g. circuitry, dedicated logic, etc.), software, or a combination of both. Although the processes are described below in terms of some sequential operations, it should be appreciated that some of the operations described may be performed in a different order. Moreover, some operations may be performed in parallel rather than sequentially.

The embodiments described herein can be used in computer simulations of various different physical systems and physical objects (for example, an aircraft's wing or a blade in a turbine) in order to determine whether a particular design of the system or object satisfies particular requirements for the system or object. For example, there might be certain design requirements relating to aerodynamic properties and physical strength of an aircraft's wing, and the multiphysics simulations can be used to determine is a particular design satisfies those design requirements. FIG. 1 shows a method in which these design requirements can be tested relative to a particular design of a system or object which is being simulated. In operation 10 of FIG. 1, a data processing system (e.g., a computer executing simulation software to provide a simulation system) can receive data about a design for a system or object. The data can be created in CAD software on a data processing system, and the data can include geometry information (e.g., sizes and shapes) about the system or object, material information about the material(s) that will be used to manufacture the system or object, and information about external forces and an environment surrounding the system or object (e.g., wind speed, temperatures, etc.). Then in operation 12, the data processing system can perform one or more multiphysics simulations (such as simulations using different physics solvers over different spaces in the simulations) to evaluate the design of the system or object. These multiphysics simulations can use the aspects and embodiments described herein. In operation 14, the designer can evaluate the results of one or more simulations to determine whether the design of the system or object satisfies certain desired criteria for the design. This determination is shown in operation 16. If the one or more criteria are satisfied, then the designer in operation 20 can provide data about the system or object to allow the fabrication or manufacture of the system or object. For example, if the one or more criteria are satisfied, a CAD file can be produced that describes how to build the system or object, and the system or object can be manufactured based on that CAD file. If the criteria are not satisfied as determined in operation 16, the designer can revise the design in operation 18 (for example, by changing sizes and/or materials used in the system or object, etc.) and repeat the process by performing additional further simulations to evaluate the redesigned system or object. This can be repeated until the desired criteria are achieved for the system or object.

Multiphysics simulations normally require coupling of different physics problems that often use different definitions of physical space so that the different definitions mean the physical spaces are not identical and contain portions that do not overlap; for example, a first physics solver uses a first surface (e.g., a first mesh from a source geometry) that is different than a second surface (a second mesh in a target geometry) used by a second physics solver, and the values on the first surface from the first physics solver need to be mapped to nodes in the second mesh on the second surface before the second solver can be used. The different surfaces cause non-conformal regions where there are no values from the first surface (e.g., the source geometry) that can be directly mapped to the second surface (the target geometry). This problem is common for wind turbines, aircraft wings, turbomachinery blades, etc. as the surfaces or volumes are modeled with non-conformal geometries. This problem is also common for electric motors and generators and power control systems (e.g., bus bars) as the volumes are modeled with non-conformal volumes. FIG. 2A shows an example of two geometries which do not conform to each other; in other words, the two geometries do not completely overlap in simulated physical space. This can occur when, for example, one physical simulation (performed with a first physics solver) is limited to a first portion of an object (e.g., the front of an aircraft's wing) and another physical simulation (performed with a second physics solver) may be limited to a second portion of the object, where the second portion is different than the first portion but overlaps with the first portion.

In the example shown in FIG. 2A, the source geometry 101 is different than the target geometry 103, and this can be seen, on the right side of FIG. 2A, when the two geometries are overlapped. When the two geometries are overlapped in a coordinate system (e.g., x, y, z) that is common to both geometries, there are non-conformal regions. In the example of FIG. 2A, the non-conformal region 109 is a region where the source geometry 101 extends beyond the target geometry 103 (e.g., because the target geometry did not include this region 109 in its definition of the simulated physical space). The non-conformal region 109 can be ignored in one embodiment because the physical simulation that uses data from the target geometry does not need any data from non-conformal region 109. On the other hand, non-conformal region 107 is a region where the target geometry 103 extends beyond the source geometry 101, but the physical simulation that uses data from the target geometry will need data from this non-conformal region 107 in order to compute solutions from the physical simulation based on the target geometry. All of the nodes in the overlapped region (shown by the hatching on the overlapped region in the right side of FIG. 2A) between the source geometry 101 and the target geometry 103 can use a standard mapping (that is known in the art) to map the physics solution data from nodes in the source geometry (e.g., nodes in a surface mesh on the surface geometry 101) to corresponding nodes (e.g., at the same coordinate position in the common coordinate system) in the target geometry (e.g., nodes in a surface mesh on the target geometry); as shown in FIG. 2A, this means that most nodes in the target geometry will have mapped physics solution data from the source geometry, however nodes in the non-conformal region 107 will not receive any mapped data. These nodes in the non-conformal region 107 are referred to as unmapped nodes. The embodiments described herein can be used to provide data for those nodes in the non-conformal region 107 in the target geometry. An example of those nodes in non-conformal region 107 are shown in FIG. 2B. In particular, FIG. 2B shows nodes 111 (in the surface mesh in the target geometry) in the non-conformal region 107 that can use the embodiments described herein to create physics solution data at each of those nodes 111.

An example of a method according to at least one embodiment is shown in FIG. 4. This method can be used to couple multiple physics solutions (e.g., a first physics solution and a second physics solution) in a multi-physics simulation that includes non-conformal spaces by using extrapolation to determine data values for unmapped nodes (such as nodes 111 in FIG. 2B), and this extrapolation can be performed by computing extrapolated values based on both mapped values from mapped nodes and data for unmapped nodes. The extrapolated values for an unmapped node can be computed using a set of equations that include mapped values from nearby mapped nodes and data for nearby unmapped nodes. The methods and systems can provide improved computational efficiency by reducing the amount of memory required for the computations relative to prior approaches referred to above. Thus, these embodiments can improve the operation of many simulation systems. In operation 301 in FIG. 4, a simulation system can create (or receive previously created) non-conformal source and target mesh geometries. FIGS. 2A and 2B show an example of such non-conformal source and target geometries. These mesh geometries can be defined in a common coordinate space (e.g., a common x, y, z coordinate space used for both geometries). In operation 303, the simulation system can retrieve physics solution data at the nodes on the source geometry (e.g., a surface mesh or volume mesh in the source geometry), and this solution data can be from a first physics solver. Once mapped to the target geometry, this solution data can be used by a second physics solver as is known in the art. The mapping of this solution data in the conformal regions 105 or portions between the source and target geometries can occur in operation 305 when the simulation system performs this mapping. In the conformal region 105 shown in FIG. 2B by the hatching, all of the nodes on the target mesh can directly receive their particular solution data from their corresponding nodes on the source mesh in operation 305.

In operation 307, the simulation system can identify the nodes in the target mesh that are not mapped by operation 305; these nodes are referred to as unmapped nodes, such as the unmapped nodes 111 shown in FIG. 2B. In one embodiment, the identification of unmapped nodes may be performed on the basis of the difference in geometry without relying on operation 305, so operation 307 may be performed before operation 305. Once the list of identified unmapped nodes has been produced by operation 307, the simulation system can determine, in operation 309, a set of nearby nodes for each unmapped node that will be used in the extrapolation method described below to derive solution values for each unmapped node. In one embodiment, operation 309 can first identify a set of neighbor faces or elements near each unmapped node that has been identified by operation 307; the faces or elements are portions of the mesh and can be the typical mesh elements. Examples of a mesh element include: a triangular face in a surface mesh, a quadrilateral face in a surface mesh, a tetrahedral element in a volume (three dimensional) mesh, a hexahedral element in a volume mesh, a triangular prism element in a volume mesh, a pyramid element in a volume mesh, etc. Each of these mesh elements include nodes at their vertices. These identified neighbor faces or elements can be used to identify nearby nodes for each unmapped node as described further below.

Figure 3:
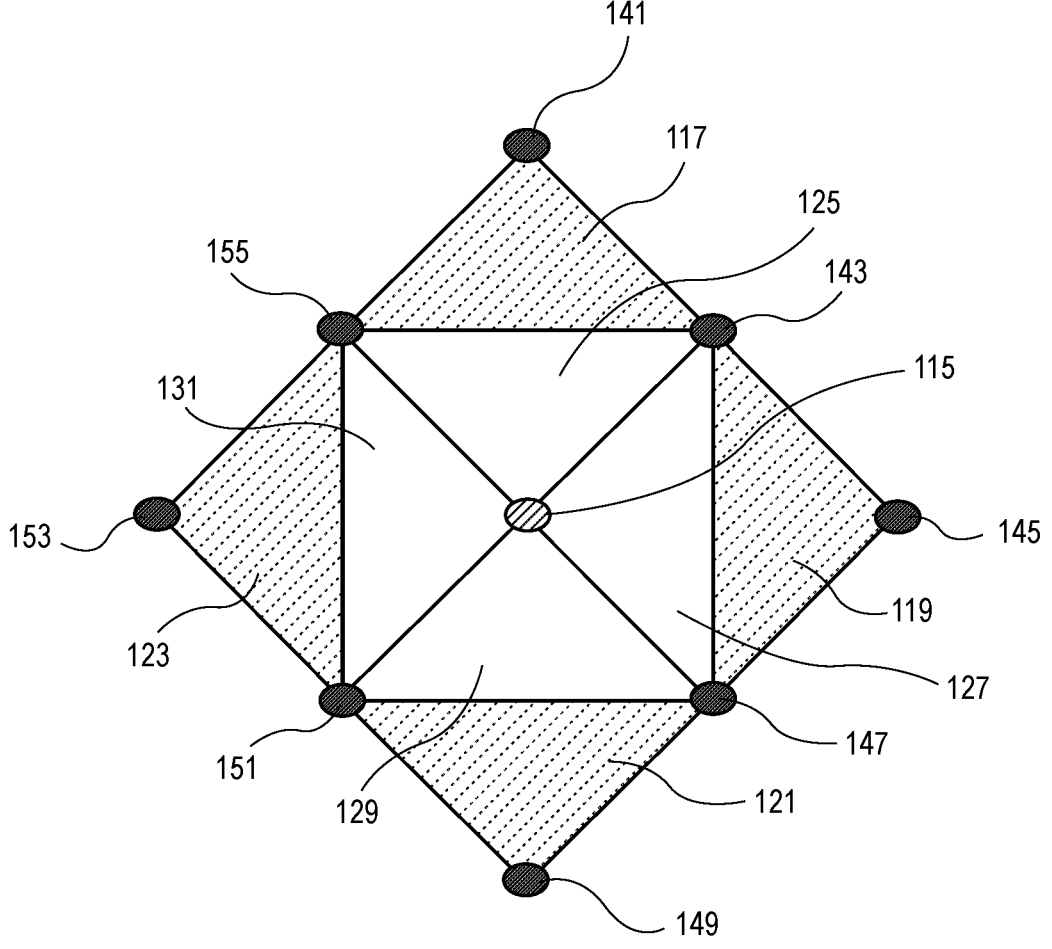
FIG. 3 shows an example of an unmapped node surrounded by neighboring nodes and faces (also referred to as elements).

FIG. 3 shows an example of an unmapped node 115 in a triangular surface mesh and shows how, in one embodiment, the nearby nodes can be defined. A neighbor face or element can be defined, in one embodiment, as any nearby element that does not contain the unmapped node (unmapped node 115 in this example). Thus, faces 117, 119, 121, and 123 can be defined as neighbor faces or elements in this example. Faces 125, 127, 129, and 131 contain the unmapped node 115 (unmapped node 115 is a vertex for each of faces 125, 127, 129, and 131), so they are not defined as a nearby element. In one embodiment, the nearby nodes can be defined as all of the nodes on each of the nearby neighbor elements, so in the case of the example in FIG. 3, the nearby nodes can be defined as nodes 141, 143, 145, 147, 149, 151, 153, and 155. How nearby is defined can depend upon the implementation of this method. For example, any element that shares an edge with an element containing the unmapped node can be defined as a nearby neighbor element; in another example, any element that shares a node with an element containing the unmapped node can be defined as a nearby neighbor element; in another example, any element containing a node or point within a selected radius of the unmapped node can be defined as a nearby neighbor element; in yet another example, any element with a centroid within a selected radius of the unmapped node can be defined as a nearby neighbor element. The selected radius can be varied to increase or decrease the number of nearby nodes that are ultimately identified by operation 309. A larger radius will likely produce more unknowns per equation in a set of equations (described further below), which may produce some benefits such as improved mapping, but it is expected that a smaller radius (such as one that would produce the set of nearby nodes 141, 143, 145, 147, 149, 151, 153, and 155 shown in FIG. 3) will be adequate in many scenarios. Once the set of nearby neighbor nodes has been identified for each unmapped node by operation 309 in a simulation system, the simulation system can proceed to operation 311 in FIG. 4. In one embodiment, a set of neighbor nodes for an unmapped node may include (1) one or more mapped nodes, or (2) one or more unmapped nodes, or (3) a combination of one or more unmapped nodes and one or more mapped nodes. Constraining the processing to a set of neighbor nodes can reduce memory consumption during processing in a simulation system, and this provides improved computational efficiency relative to the prior art.

In operation 311, the simulation system can use an extrapolation strategy to determine physics solution values for each unmapped node based on the set of nearby nodes, where the set of nearby nodes includes: (a) one or more mapped nodes or (b) one or more unmapped nodes or (c) a combination of one or more unmapped nodes and one or more mapped nodes. In one extrapolation strategy, the mapped nodes contribute physics solution values in a mathematical relationship, such as a set of equations based on element shape functions in one embodiment, and the unmapped nodes contribute coefficients (e.g., coefficients that describe the relationship in space in the target mesh, such as distance, relative to other nodes in the set of nearby nodes in the target mesh) in the set of equations. Operation 311 creates this relationship for each unmapped node in the set of nearby nodes. Further details about this extrapolation strategy are provided below. Other alternative extrapolation strategies can also be used, such as (for example): use of radial basis functions operating on the set of nearby nodes; or linear 4-point exact with quadratic least squares correction; or a linear least squares approach; or a finite element shell discretization for unmapped nodes on surface geometries; or a finite element discretization for unmapped nodes on volume geometries.

Figures 5A, 5B:
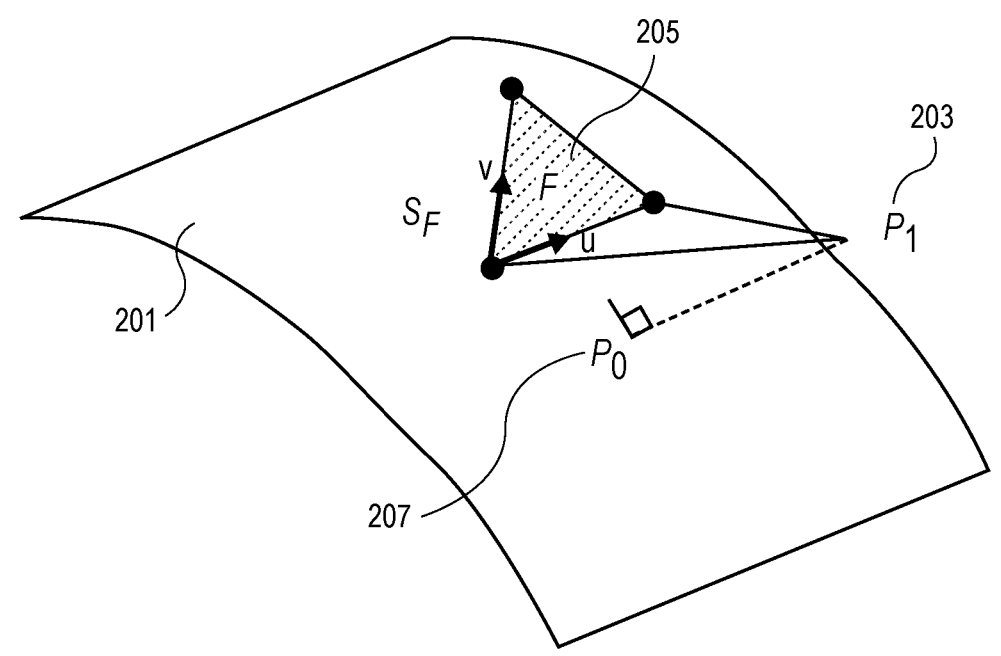
FIG. 5A shows an example of target surface containing an unmapped node.
FIG. 5B shows an example of surface element shape functions that can be used to extrapolate values for unmapped nodes.
Figure 5C:
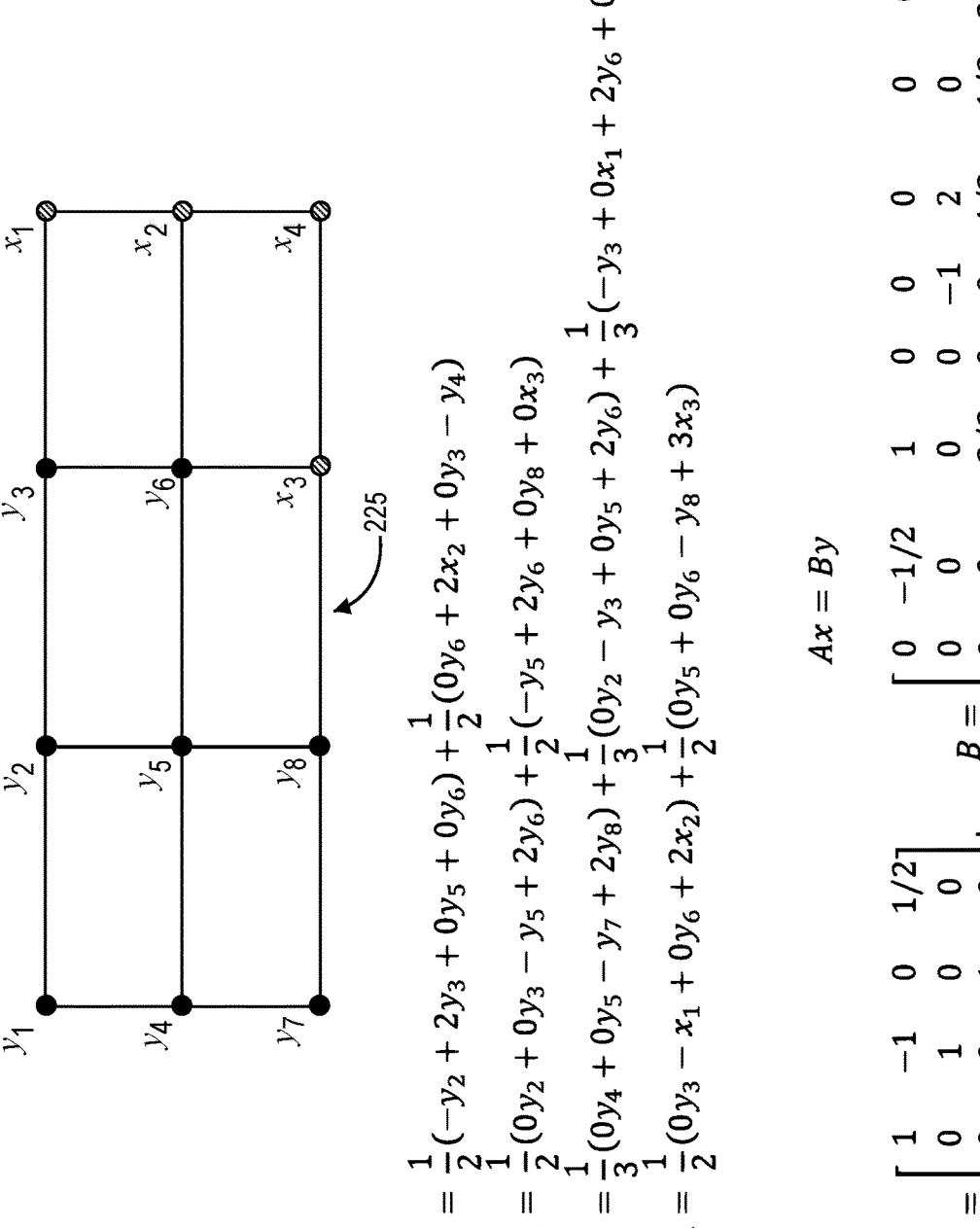
FIG. 5C shows an example of an extrapolation for unmapped nodes through a set of equations that contain both mapped and unmapped variables.
Figure 5D:
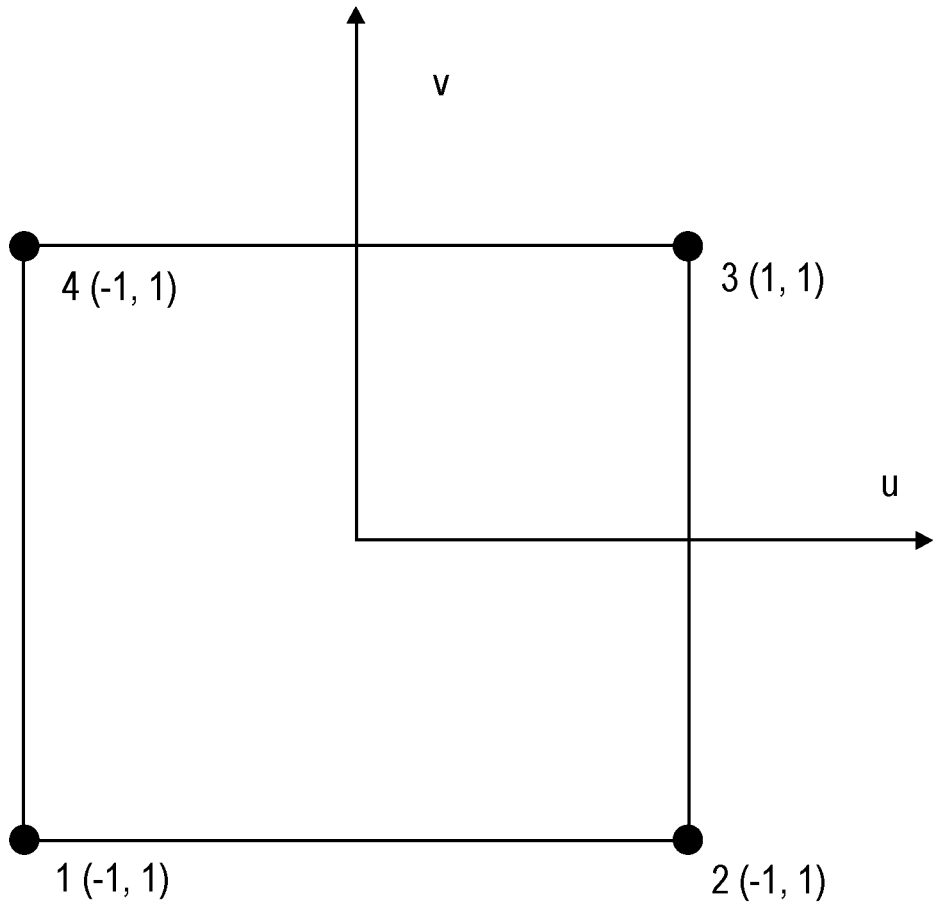
FIG. 5D shows an example of a definition of iso-parametric coordinates that can be used in the example of FIG. 5C.

Operation 311 can create the relationship based on element shape functions that describe the neighbor elements. FIGS. 5A and 5B show an example of how this relationship can be created. FIGS. 5C and 5D also provide a more specific example of the creation of this relationship in a system of equations. In FIG. 5A, an unmapped node $P_1$ (unmapped node 203) on a target surface is near a neighbor face F (face 205) which is on a surface $S_F$ (surface 201) that may be different than the target surface. The nearest point to the unmapped node 203 on the surface 201 is point 207 (point $P_0$). A parametric representation of the face 205 can define the surface 201 as $S_F$ (x,y,z)=r (u,v), where u,v are iso-parametric coordinates along the surface 201 (as shown in FIG. 5A). A relationship between the physics solution data $\phi$ at point $P_1$ and the data at the nodal coordinates $x_j$ on node j of the k th face can be expressed using the surface shape function 215 shown in FIG. 5B. Since each $\phi_k (x_j)$ may be either mapped or unmapped, a system or set of equations is created (see the example in FIG. 5C). If $\phi_k (x_j)$ is unmapped, its value is unknown and it contributes to coefficients in one of the matrices used to compute the system or set of equations. If $\phi_k (x_j)$ is mapped, then its physics solution data is known and it contributes that data to a matrix based on the set of equations. In one embodiment, the contribution to $\phi (P_1)$ from all neighbor faces can be combined using a weighted average, such as the weighted average 217 shown in FIG. 5B. In one embodiment, the weights a can be set, for example, based on the inverse distance between the unmapped node and the face centroid.

FIG. 5C shows an example of a specific set of equations (a mathematical relationship) created for a target mesh 225 containing, in a non-conformal region of the target mesh, four unmapped nodes ($x_1$, $x_2$, $x_3$, and $x_4$) and the target mesh also contains eight mapped nodes ($y_1$, $y_2$, $y_3$, $y_4$, $y_5$, $y_6$, $y_7$, and $y_5$); all of these nodes were identified and selected as nearby nodes (e.g., using operation 309) for the four unmapped nodes. The values of the eight mapped nodes ($y_1$, $y_2$, $y_3$, $y_4$, $y_5$, $y_6$, $y_7$, and $y_5$) contain the physics solution data mapped from a first physics solver. Based on the example of the element shape functions in FIGS. 5A and 5B, the set of four equations shown in FIG. 5C is created, and this set of equations can be expressed as a set of matrices A and B (shown in FIG. 5C) in the matrix equation Ax=By. Solving this set of equations can produce the physics solution data (by solving for $x_1$, $x_2$, $x_3$, and $x_4$) for each unmapped node in this example. The solution is produced in operation 313 in FIG. 4. In this example, a linear system was created for a surface face based extrapolation, but this can be extended to volumes with three dimensional elements.

Referring to FIG. 5C, let x be the unmapped nodes ($x_1$, $x_2$, $x_3$, and $x_4$) and let y be the mapped nodes ($y_1$, $y_2$, $y_3$, $y_4$, $y_5$, $y_6$, $y_7$, and $y_8$) with numbering as shown in FIG. 5C. Each node uses an average of extrapolated values from each face, assuming equal weights. The extrapolation is based off of the shape functions, using the following formula for each $x_i$, $0 \leq i \leq 4$:

$$\phi_k(x_i) = \sum_{j=1}^{n_{nodes,k}} \phi_k(x_j) N_j(u_k, v_k),$$

which is then combined in a weighted average:

$$\phi(x_i) = \sum_{k=1}^{n_{nbrFaces}} \left[ \frac{\alpha_k}{\sum_m a_m} \phi_k(x_i) \right].$$

For the bi-linear quadrilateral elements shown in FIG. 5C the following iso-parametric coordinates definition as shown in FIG. 5D can be used, resulting in the following shape functions:

$$N_1 = \frac{1}{4}(1-u)(1-v)$$

$$N_2 = \frac{1}{4}(1+u)(1-v)$$

$$N_3 = \frac{1}{4}(1+u)(1+v)$$

$$N_4 = \frac{1}{4}(1-u)(1+v)$$

Unmapped node 1 will use two neighbor faces: $y_5$-$y_6$-$y_3$-$y_2$ and $x_3$-$x_4$-$x_2$-$y_6$. The parametric coordinate of $x_1$ in the coordinate system defined by the first face is (u, v)=(3, 1), for which the shape functions evaluate to ($N_1$, $N_2$, $N_3$, $N_4$)=0, 0, 2, −1. The parametric coordinate of $x_1$ in the coordinate system defined by the second face is (u, v)=(1, 3), for which the shape functions evaluate to ($N_1$, $N_2$, $N_3$, $N_4$)=0, −1, 2, 0. Subsequent application of the two above equations (also in FIG. 5B) gives the following expression for $x_1$:

$$x_1 = \frac{1}{2}(-y_2 + 2y_3 + 0y_5 + 0y_6) + \frac{1}{2}(0y_6 + 2x_2 + 0y_3 - y_4).$$

Similar expressions can be found for the other unmapped nodes:

$$x_2 = \frac{1}{2}(0y_2 + 0y_3 - y_5 + 2y_6) + \frac{1}{2}(-y_5 + 2y_6 + 0y_8 + 0x_3),$$

$$x_3 = \frac{1}{3}(0y_4 + 0y_5 - y_7 + 2y_8) +$$
$$\frac{1}{3}(0y_2 - y_3 + 0y_5 + 2y_6) + \frac{1}{3}(-y_3 + 0x_1 + 2y_6 + 0x_2),$$

$$x_4 = \frac{1}{2}(0y_3 - x_1 + 0y_6 + 2x_2) + \frac{1}{2}(0y_5 + 0y_6 - y_8 + 3x_3).$$

The system is linear and can be written in the form:

$$Ax = By \text{ where:}$$

$$A = \begin{bmatrix} 1 & -1 & 0 & 1/2 \\ 0 & 1 & 0 & 0 \\ 0 & 0 & 1 & 0 \\ 1/2 & -1 & -1 & 1 \end{bmatrix},$$

$$B = \begin{bmatrix} 0 & -1/2 & 1 & 0 & 0 & 0 & 0 & 0 \\ 0 & 0 & 0 & 0 & -1 & 2 & 0 & 0 \\ 0 & 0 & -2/3 & 0 & 0 & 4/3 & -1/3 & 2/3 \\ 0 & 0 & 0 & 0 & 0 & 0 & 0 & 1/2 \end{bmatrix}.$$

The matrix-vector product b=By can be computed explicitly to form the right-hand-side vector, and the solution is given by solving the linear system of equations for x.

$$Ax = b$$

Once operation 313 produces the physics solution data for each unmapped node, then the next physics solver can use the physics solution data for all of the nodes on the target mesh to compute the next set of physics solution data in operation 315. The method shown in FIG. 4 can be repeated multiple times to couple more than 2 physics simulations in a multiphysics simulation. For example, in a case where 3 physics simulations are coupled to simulate a physical object to be manufactured, the method shown in FIG. 4 can be repeated twice.

Systems and methods have been disclosed to calculate data fields in non-overlapping regions between different representations of a physical object or system. The data fields can be calculated to provide a general solution for data mapping problems between two non-conformal geometric surfaces or volumes. In one embodiment, the disclosed mechanism can map data from a source geometry to produce smooth and/or physically realistic data fields in a target geometry accounting for geometric shapes consistent in profile with the mapped data.

The disclosed methods and systems can map various non-conformal data in complex or arbitrary geometries or topologies, such as physically close points with distinct topologies. A general solution can be provided to the non-conformal geometry mapping problem according to extrapolation relationships established between mapped and unmapped nodes in the target geometry.

In one embodiment, the disclosed methods and systems can map data for non-conformal geometries with quality of continuity for system coupling simulation without generating non-physical target data nor folded mesh on the target geometry. The disclosed methods and systems can produce a smooth solution for mapped data even in the absence of a surface parameterization. Smoothness of the data may be measured based on, for example, the number of continuous derivatives or orders of derivatives over a domain of the mapped data.

In some embodiments, the disclosed methods and systems can generate data in a non-overlap region without being bounded by nearby mapped values. For example, the disclosed methods and systems can map a displacement field to a geometric extrusion which is being rotated in an unmapped region without generating a corner at the interface of the non-overlapping section.

The disclosed methods and systems can perform data mapping between discrete representations of surface or volume geometries for which the source and target geometries have different physical definitions but are interpreted as representing the same physical system. The data can be mapped to populate a data field on a region of a discrete representation of a geometric surface or volume for which data is missing or absent, but data exists on other parts of the geometry. Discrete data field can be mapped with a geometric region represented as a collections of discrete elements.

Figure 6:
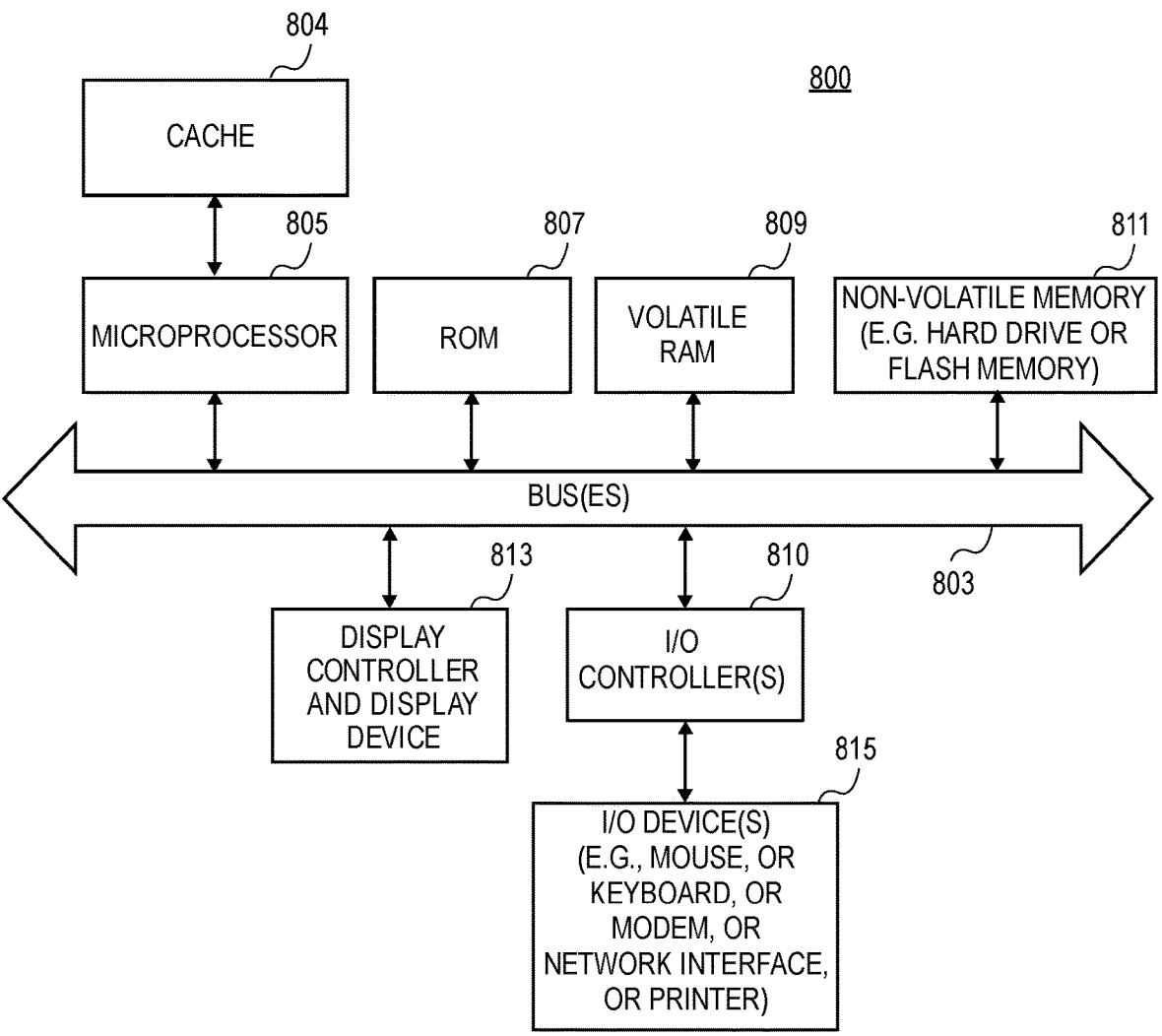
FIG. 6 shows an example of a data processing system that can perform one or more of the methods described herein and also be used to implement a system that can perform one or more embodiments described herein.

FIG. 6 shows one example of a data processing system 800, which may be used with one embodiment. For example, the system 800 may be implemented to provide a system or device that performs any one of the methods described herein. Note that while FIG. 6 illustrates various components of a device, it is not intended to represent any particular architecture or manner of interconnecting the components as such details are not germane to the disclosure. It will also be appreciated that network computers and other data processing systems or other consumer electronic devices, which have fewer components or perhaps more components, may also be used with embodiments of the disclosure.

As shown in FIG. 6, the device 800, which is a form of a data processing system, includes a bus 803 which is coupled to a microprocessor(s) 805 and a ROM (Read Only Memory) 807 and volatile RAM 809 and a non-volatile memory 811. The microprocessor(s) 805 may retrieve the instructions from the memories 807, 809, 811, or cache 804 coupled to microprocessor(s) 805, and execute the instructions to perform operations described above. The microprocessor(s) 805 may contain one or more processing cores and may include or be coupled to cache 804. The bus 803 interconnects these various components together and also interconnects these components 805, 807, 809, and 811 to a display controller and display device 813 and to peripheral devices such as input/output (110) devices 815 which may be touchscreens, mice, keyboards, modems, network interfaces, printers and other devices which are well known in the art. Typically, the input/output devices 815 are coupled to the system through input/output controllers 810. The volatile RAM (Random Access Memory) 809 is typically implemented as dynamic RAM (DRAM), which requires power continually in order to refresh or maintain the data in the memory.

The non-volatile memory 811 is typically a magnetic hard drive or a magnetic optical drive or an optical drive or a DVD RAM or a flash memory or other types of memory systems, which maintain data (e.g., large amounts of data) even after power is removed from the system. Typically, the non-volatile memory 811 will also be a random access memory although this is not required. While FIG. 6 shows that the non-volatile memory 811 is a local device coupled directly to the rest of the components in the data processing system, it will be appreciated that embodiments of the disclosure may utilize a non-volatile memory which is remote from the system, such as a network storage device which is coupled to the data processing system through a network interface such as a modem, an Ethernet interface or a wireless network. The bus 803 may include one or more buses connected to each other through various bridges, controllers and/or adapters as is well known in the art.

Portions of what was described above may be implemented with logic circuitry such as a dedicated logic circuit or with a microcontroller or other form of processing core that executes program code instructions. Thus processes taught by the discussion above may be performed with program code such as machine-executable instructions that cause a machine that executes these instructions to perform certain functions. In this context, a "machine" may be a machine that converts intermediate form (or "abstract")

instructions into processor specific instructions (e.g., an abstract execution environment such as a "virtual machine" (e.g., a Java Virtual Machine), an interpreter, a Common Language Runtime, a high-level language virtual machine, etc.), and/or electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

The disclosure also relates to an apparatus for performing the operations described herein. This apparatus may be specially constructed for the required purpose, or it may comprise a general-purpose device selectively activated or reconfigured by a computer program stored in the device. Such a computer program may be stored in a non-transitory computer readable storage medium, such as, but not limited to, any type of disk including floppy disks, optical disks, CD-ROMs, and magnetic-optical disks, DRAM (volatile), flash memory, read-only memories (ROMs), RAMs, EPROMs, EEPROMs, magnetic or optical cards, or any type of media suitable for storing electronic instructions, and each coupled to a device bus.

A machine readable medium includes any mechanism for storing information in a form readable by a machine (e.g., a computer). For example, a non-transitory machine readable medium includes read only memory ("ROM"); random access memory ("RAM"); magnetic disk storage media; optical storage media; flash memory devices; etc.

An article of manufacture may be used to store program code. An article of manufacture that stores program code may be embodied as, but is not limited to, one or more non-transitory memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)) and then stored in non-transitory memory (e.g., DRAM or flash memory or both) in the client computer.

The preceding detailed descriptions are presented in terms of algorithms and symbolic representations of operations on data bits within a device memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "determining," "sending," "terminating," "waiting," "changing," or the like, refer to the action and processes of a device, or similar electronic computing device, that manipulates and transforms data represented as physical (electronic) quantities within the device's registers and memories into other data similarly represented as physical quantities within the device memories or registers or other such information storage, transmission or display devices.

The processes and displays presented herein are not inherently related to any particular device or other apparatus. Various general-purpose systems may be used with programs in accordance with the teachings herein, or it may prove convenient to construct a more specialized apparatus to perform the operations described. The required structure for a variety of these systems will be evident from the description below. In addition, the disclosure is not described with reference to any particular programming language. It will be appreciated that a variety of programming languages may be used to implement the teachings of the disclosure as described herein.

In the foregoing specification, specific exemplary embodiments have been described. It will be evident that various modifications may be made to those embodiments without departing from the broader spirit and scope set forth in the following claims. The specification and drawings are, accordingly, to be regarded in an illustrative sense rather than a restrictive sense.

What is claimed is:

1. A non-transitory machine readable medium storing executable program instructions which when executed by a data processing system cause the data processing system to perform a method for multi-physics simulation, comprising:

simulating characteristics of a first physics for a physical object represented by a first mesh model in a source space, characteristics of the first physics associated with data values at nodes in the source space;

receiving a second mesh model representing the physical object in a target space having nodes, the second mesh model for a second physics of the physical object;

determining a mapping of the data values from the nodes in the source space to the nodes in the target space, at least some of the nodes in the target space being mapped nodes, each mapped node to receive, through the mapping, at least some data values from the nodes in the source space, identifying a set of one or more nodes in the target space as unmapped nodes, each unmapped node without receiving any data values from the nodes in the source space;

determining, for each unmapped node in the target space, a set of nearby neighbor nodes in the target space including two or more mapped nodes and two or more unmapped nodes;

creating an extrapolation relationship between the two or more mapped nodes and the two or more unmapped nodes in the set of nearby neighbor nodes for the unmapped node in the target space;

generating data values for the unmapped node in the target space based on the relationship using data values of the two or more mapped nodes of the set of nearby neighbor nodes and positions of the two or more unmapped nodes in the set of nearby neighbor nodes; and simulating characteristics of the second physics for the physical object represented by the second mesh model in the target space based on the data values associated with the first physics received from the source space, the characteristics of the first physics and the characteristics of the second physics simulated for a design of the physical object before the physical object is manufactured.

2. The non-transitory machine readable medium as in claim 1, wherein the set of unmapped nodes are in a portion of the target space that does not overlap with the source space and the two or more mapped nodes are in a portion of the target space that does overlap with the source space, and wherein the data values at nodes in the source space represent one or more physical values from a first physics solution about a simulated object being designed in a simulation system in the data processing system.

3. The non-transitory machine readable medium as in claim 2, wherein the nodes in the source space are nodes in a first mesh, and the nodes in the target space are nodes in a second mesh, and the first mesh and the second mesh have non-conformal geometries.

4. The non-transitory machine readable medium as in claim 2, wherein the source space and the target space are one of: (a) a surface, or (b) a volume.

5. The non-transitory machine readable medium as in claim 3, wherein the one or more physical values from the first physics solution are used to compute one or more physical values in a second physics solution to determine the characteristics of the second physics for the simulated object before the physical object is manufactured based on the simulated object, and wherein the mapping couples the first physics solution to the second physics solution.

6. The non-transitory machine readable medium as in claim 5, wherein the data values at each of the two or more unmapped nodes are extrapolated from the data values from the two or more mapped nodes and coefficient data of the two or more unmapped nodes in the set of nearby neighbor nodes.

7. The non-transitory machine readable medium as in claim 5, wherein a neighbor node in the set of nearby neighbor nodes is nearby to an unmapped node when: (a) the neighbor node is within a first radius from the unmapped node; or (b) the neighbor node is in a face that shares an edge with a face containing the unmapped node; or (c) the face containing the unmapped node shares a node with a face containing the neighbor node.

8. The non-transitory machine readable medium as in claim 6, wherein the relationship comprises a set of equations that include first physics solution data from nearby mapped nodes and coefficients for nearby unmapped nodes.

9. The non-transitory machine readable medium as in claim 8, wherein, for each unmapped node, computed contributions from all nearby neighbor nodes are combined in a weighted average.

10. The non-transitory machine readable medium as in claim 8, wherein a number of unmapped nodes in the set of equations is equal to a number of equations in the set of equations.

11. A method performed by a data processing system for multi-physics simulation, the method comprising:

simulating characteristics of a first physics for a physical object represented by a first mesh model in a source space, characteristics of the first physics associated with data values at nodes in the source space;

receiving a second mesh model representing the physical object in a target space having nodes, the second mesh model for a second physics of the physical object;

determining a mapping of the data values from the nodes in the source space to the nodes in the target space, at least some of the nodes in the target space being mapped nodes, each mapped node to receive, through the mapping, at least some data values from the nodes in the source space, identifying a set of one or more nodes in the target space as unmapped nodes, each unmapped node without receiving any data values from the nodes in the source space;

determining, for each unmapped node in the target space, a set of nearby neighbor nodes in the target space including two or more mapped nodes and two or more unmapped nodes;

creating an extrapolation relationship between the two or more mapped nodes and the two or more unmapped nodes in the set of nearby neighbor nodes for the unmapped node in the target space;

generating data values for the unmapped node in the target space based on the relationship using data values of the two or more mapped nodes of the set of nearby neighbor nodes and positions of the two or more unmapped nodes in the set of nearby neighbor nodes; and simulating characteristics of the second physics for the physical object represented by the second mesh model in the target space based on the data values associated with the first physics received from the source space, the characteristics of the first physics and the characteristics of the second physics simulated for a design of the physical object before the physical object is manufactured.

12. The method as in claim 11, wherein the set of unmapped nodes are in a portion of the target space that does not overlap with the source space and the two or more mapped nodes are in a portion of the target space that does overlap with the source space, and wherein the data values at nodes in the source space represent one or more physical values from a first physics solution about a simulated object being designed in a simulation system in the data processing system.

13. The method as in claim 12, wherein the nodes in the source space are nodes in a first mesh, and the nodes in the target space are nodes in a second mesh, and the first mesh and the second mesh have non-conformal geometries.

14. The method as in claim 12, wherein the source space and the target space are one of: (a) a surface, or (b) a volume.

15. The method as in claim 13, wherein the one or more physical values from the first physics solution are used to compute one or more physical values in a second physics solution to determine the characteristics of the second physics for the simulated object before the physical object is manufactured based on the simulated object, and wherein the mapping couples the first physics solution to the second physics solution.

16. The method as in claim 15, wherein the data values at each of the two or more unmapped nodes are extrapolated from the data values from the two or more mapped nodes and coefficient data of the two or more unmapped nodes in the set of nearby neighbor nodes.

17. The method as in claim 15, wherein a neighbor node in the set of nearby neighbor nodes is nearby to an unmapped node when: (a) the neighbor node is within a first radius from the unmapped node; or (b) the neighbor node is in a face that shares an edge with a face containing the unmapped node; or (c) the face containing the unmapped node shares a node with a face containing the neighbor node.

18. The method as in claim 16, wherein the relationship comprises a set of equations that include first physics solution data from nearby mapped nodes and coefficients for nearby unmapped nodes.

19. The method as in claim 18, wherein, for each unmapped node, computed contributions from all nearby neighbor nodes are combined in a weighted average.

20. The method as in claim 18, wherein a number of unmapped nodes in the set of equations is equal to a number of equations in the set of equations.

* * * * *